(12) United States Patent
Xu et al.

(10) Patent No.: US 12,300,502 B2
(45) Date of Patent: May 13, 2025

(54) METHOD FOR FABRICATING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventors: Chenming Xu, Hefei (CN); Hongbo Lin, Hefei (CN); He Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 250 days.

(21) Appl. No.: 17/842,788

(22) Filed: Jun. 17, 2022

(65) Prior Publication Data

US 2023/0326760 A1 Oct. 12, 2023

Related U.S. Application Data

(63) Continuation of application No. PCT/CN2022/087494, filed on Apr. 18, 2022.

(30) Foreign Application Priority Data

Apr. 11, 2022 (CN) .......................... 202210373096.0

(51) Int. Cl.
*H01L 21/31* (2006.01)
*H01L 21/3105* (2006.01)
(Continued)

(52) U.S. Cl.
CPC .. *H01L 21/31055* (2013.01); *H01L 21/76879* (2013.01); *H01L 21/7688* (2013.01)

(58) Field of Classification Search
CPC ......... H01L 21/31055; H01L 21/76879; H01L 21/7688; H01L 21/76834; H01L 21/76837;
(Continued)

(56) References Cited

U.S. PATENT DOCUMENTS

| | | | |
|---|---|---|---|
| 4,855,017 A * | 8/1989 | Douglas .............. | H01L 21/3085 438/700 |
| 6,277,752 B1 | 8/2001 | Chen | |

(Continued)

FOREIGN PATENT DOCUMENTS

| | | | | |
|---|---|---|---|---|
| CN | 101106066 A * | 1/2008 | ....... | H01L 21/02052 |
| CN | 101393842 A * | 3/2009 | ....... | H01L 21/76804 |

(Continued)

*Primary Examiner* — Mohammed Shamsuzzaman
(74) *Attorney, Agent, or Firm* — Kilpatrick Townsend & Stockton LLP (57) ABSTRACT

Embodiments relate to the field of semiconductor manufacturing technology, and more particularly, to a method for fabricating a semiconductor structure, and a semiconductor structure. The method for fabricating a semiconductor structure includes: providing a substrate covered with a conductive layer; removing part of the conductive layer by dry etching to form a first groove, a depth of the first groove being less than a thickness of the conductive layer, and there being polymer residue on a groove wall of the first groove; removing part of the conductive layer corresponding to the groove wall and a groove bottom of the first groove to form conductive lines and a second groove between adjacent two of the conductive lines; and forming a passivation layer filled into the second groove.

17 Claims, 7 Drawing Sheets

(51) Int. Cl.
*H01L 21/768* (2006.01)
*H01L 21/76* (2006.01)

(58) Field of Classification Search
CPC ... H01L 2224/02313; H01L 2224/0236; H01L 23/5283; H01L 21/76885; H01L 21/32136; H01L 21/32139; H01L 2224/02371
See application file for complete search history.

(56) References Cited

U.S. PATENT DOCUMENTS

| | | | |
|---|---|---|---|
| 9,287,183 B1* | 3/2016 | Zhao | H01L 21/288 |
| 11,450,558 B2* | 9/2022 | Chou | H01L 21/76835 |
| 2002/0166838 A1* | 11/2002 | Nagarajan | H01L 21/3086 |
| | | | 438/719 |
| 2006/0252256 A1* | 11/2006 | Weng | H01L 21/76814 |
| | | | 438/711 |
| 2012/0289043 A1* | 11/2012 | Hsieh | H01L 21/32136 |
| | | | 438/653 |
| 2022/0157713 A1* | 5/2022 | Ho | H01L 21/32139 |

FOREIGN PATENT DOCUMENTS

| | | | | |
|---|---|---|---|---|
| CN | 102249179 A | | 11/2011 | |
| CN | 105789134 A | | 7/2016 | |
| CN | 107564867 A | | 1/2018 | |
| CN | 110875240 A | | 3/2020 | |
| CN | 111900128 A | * | 11/2020 | ....... H01L 21/76804 |
| JP | 2005175421 A | * | 6/2005 | ....... H01L 21/02052 |
| TW | 201735101 A | * | 10/2017 | ......... H01L 21/0217 |

* cited by examiner

METHOD FOR FABRICATING SEMICONDUCTOR STRUCTURE, AND SEMICONDUCTOR STRUCTURE

CROSS-REFERENCE TO RELATED APPLICATION

The present disclosure is a continuation of PCT/CN2022/087494, filed on Apr. 18, 2022, which claims priority to Chinese Patent Application No. 202210373096.0 titled "METHOD FOR FABRICATING SEMICONDUCTOR STRUCTURE, AND SEMICONDUCTOR STRUCTURE" and filed to the State Intellectual Property Office on Apr. 11, 2022, the entire contents of which are incorporated herein by reference.

TECHNICAL FIELD

Embodiments of the present disclosure relate to the field of semiconductor manufacturing technology, and more particularly, to a method for fabricating a semiconductor structure, and a semiconductor structure.

BACKGROUND

After a chip is fabricated, generally a package structure needs to be fabricated to package the chip. The package structure includes a wiring redistribution layer, which is arranged on a side of the chip provided with contact pads. The wiring redistribution layer is provided with a plurality of metal lines, where one end of each of the plurality of metal lines is connected to the contact pads, and the other end of each of the plurality of metal lines is provided with welding structures. By reasonable setting of shapes of the plurality of metal lines, arrangement of the welding structures may be changed.

SUMMARY

In a first aspect, embodiments of the present disclosure provide a method for fabricating a semiconductor structure, including:
  providing a substrate covered with a conductive layer;
  removing part of the conductive layer by dry etching to form a first groove, a depth of the first groove being less than a thickness of the conductive layer, and there being polymer residue on a groove wall of the first groove;
  removing part of the conductive layer corresponding to the groove wall and a groove bottom of the first groove to form conductive lines and a second groove between adjacent two of the conductive lines; and
  forming a passivation layer filled into the second groove.
In a possible implementation manner, the removing part of the conductive layer by dry etching to form the first groove includes:
  forming a first mask layer on the conductive layer, the first mask layer having a first etching opening; and
  etching the conductive layer by using the first mask layer as a mask to form the first groove.
In a possible implementation manner, the removing part of the conductive layer corresponding to the groove wall and a groove bottom of the first groove to form conductive lines and a second groove between adjacent two of the conductive lines includes:
  forming a second mask layer on the conductive layer, the second mask layer being provided with a second etching opening arranged directly facing the first groove, and an area of an orthographic projection of the second etching opening on the substrate being greater than an area of an orthographic projection of the first etching opening on the substrate; and
  etching the conductive layer by using the second mask layer as a mask to form the conductive lines and the second groove.
In a possible implementation manner, the forming a second mask layer on the conductive layer includes:
  after the first groove is formed, shrinking the first mask layer to increase the area of the orthographic projection of the first etching opening on the substrate, and forming the second mask layer and the second etching opening on the second mask layer.
In a possible implementation manner, the shrinking the first mask layer includes:
  etching the first mask layer to remove a sidewall of the first etching opening.
In a possible implementation manner, the etching the first mask layer includes dry etching, where an etching gas for the dry etching includes at least one of oxygen, hydrogen, or nitrogen.
In a possible implementation manner, the conductive layer is etched by using the first mask layer as a mask to form a first groove, where the depth of the first groove is ⅓ to ½ of the thickness of the conductive layer.
In a possible implementation manner, a distance between the second etching opening and the groove wall of the first groove ranges from 50 nm to 100 nm.
In a possible implementation manner, the etching the conductive layer by using the second mask layer as a mask to form the second groove includes:
  etching the conductive layer and part of the substrate by using the second mask layer as a mask to form the second groove.
In a possible implementation manner, the conductive layer is etched by means of dry etching using the first mask layer as a mask, and the conductive layer is etched by means of dry etching by using the second mask layer as a mask.
In a possible implementation manner, the removing part of the conductive layer corresponding to the groove wall and a groove bottom of the first groove to form the conductive lines and the second groove includes intermediate etching, the intermediate etching including:
  forming an intermediate mask layer on the conductive layer, the intermediate mask layer being provided with an intermediate etching opening arranged directly facing the first groove, an area of an orthographic projection of the intermediate etching opening on the substrate being greater than the area of the orthographic projection of the first etching opening on the substrate, and the area of the orthographic projection of the intermediate etching opening on the substrate being less than the area of the orthographic projection of the second etching opening on the substrate; and
  etching the conductive layer by using the intermediate mask layer as a mask to form an intermediate groove, a depth of the intermediate groove being greater than the depth of the first groove and less than a depth of the second groove.
In a possible implementation manner, after the intermediate groove is formed, the removing part of the conductive layer corresponding to the groove wall and a groove bottom of the first groove to form the conductive lines and the second groove further includes:

removing part of the conductive layer corresponding to a groove wall and a groove bottom of the intermediate groove to form the conductive lines and the second groove.

In a possible implementation manner, the forming an intermediate mask layer on the conductive layer includes:

after the first groove is formed, shrinking the first mask layer to increase the area of the orthographic projection of the first etching opening on the substrate, and forming the intermediate mask layer and the second etching opening on the intermediate mask layer.

In a possible implementation manner, the shrinking the intermediate mask layer includes:

etching the first mask layer to remove a sidewall of the first etching opening.

In a possible implementation manner, the etching the intermediate mask layer includes dry etching, and an etching gas for the dry etching includes at least one of oxygen, hydrogen, or nitrogen.

In a possible implementation manner, the intermediate etching is performed for many times, and during the intermediate etching of each time, an area of an orthographic projection of the intermediate etching opening on the substrate is greater than an area of an orthographic projection of the intermediate etching opening on the substrate in the intermediate etching of previous time.

In a possible implementation manner, before the forming a passivation layer filled into the second groove, the method further includes:

removing the second mask layer.

In a possible implementation manner, before the forming a passivation layer filled into the second groove, the method further includes: after removing the second mask layer, forming an insulating layer covering the conductive lines and the groove wall and the groove bottom of the second groove.

In a possible implementation manner, the conductive layer includes a plurality of sub-conductive layers sequentially arranged on the substrate.

In a second aspect, the embodiments of the present disclosure provide a semiconductor structure, including: a semiconductor structure formed by the above method for fabricating a semiconductor structure.

The embodiments of the present disclosure provide a method for fabricating a semiconductor structure, and a semiconductor structure. The method for fabricating a semiconductor structure includes: providing a substrate covered with a conductive layer; removing part of the conductive layer by dry etching to form a first groove, a depth of the first groove being less than a thickness of the conductive layer, and there being polymer residue on a groove wall of the first groove; removing part of the conductive layer corresponding to the groove wall and a groove bottom of the first groove to form conductive lines and a second groove between adjacent two of the conductive lines; and forming a passivation layer filled into the second groove. By removing part of the conductive layer corresponding to the groove wall of the first groove, the polymer deposited on the groove wall of the first groove can be removed synchronously, such that it is avoidable sealing in advance when the passivation layer is filled into the second groove subsequently, thereby further preventing a slit from appearing inside the passivation layer, which is advantageous to improving performance of the semiconductor structure.

BRIEF DESCRIPTION OF THE DRAWINGS

To describe the technical solutions in the embodiments of the present disclosure or existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Several implementation manners of the present disclosure are introduced below in conjunction with the accompanying drawings. Those skilled in the art should understand that the following implementation manners are only illustrative, and are not exhaustive enumerations. On the basis of these implementation manners, those skilled in the art may replace, concatenate or combine some features or some examples, which should still be regarded as disclosed contents of the present disclosure.

Generally, after one dry etching is performed on a metal layer in a wiring redistribution layer to obtain metal lines, a passivation layer covering the metal lines and filling a groove between adjacent metal lines needs to be formed to protect the metal lines formed and to ensure that the adjacent metal lines are insulated from each other. However, in the process of study, inventors of the present disclosure have noticed that the passivation layer formed by the above process flow has lower quality and poorer performance.

Figure 1:
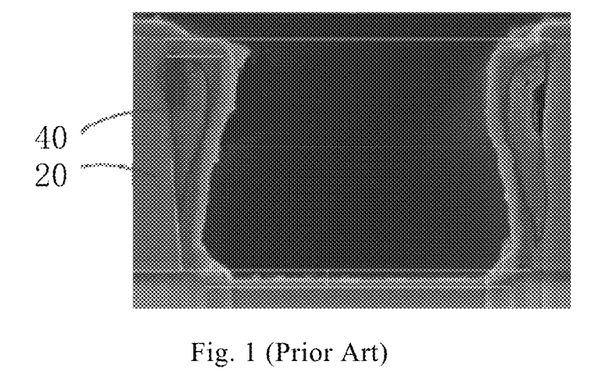
FIG. 1 is a schematic structural diagram of a conductive line formed by dry etching.
Figure 2:
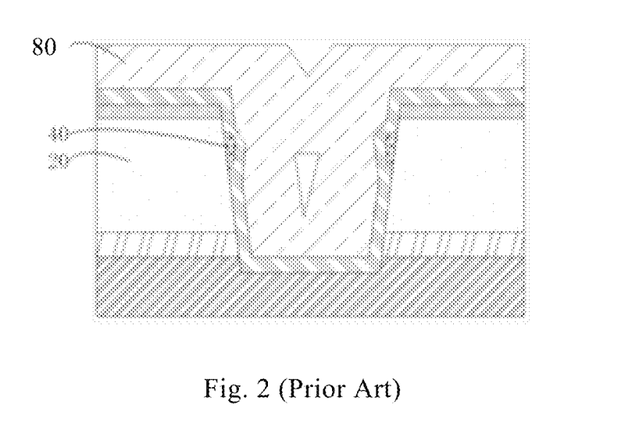
FIG. 2 is a schematic structural diagram of a passivation layer formed on the conductive line.

FIG. 1 is a schematic structural diagram of a conductive line formed by dry etching, and FIG. 2 is a schematic structural diagram of a passivation layer formed on the conductive line. The inventors of the present disclosure found that, as shown in FIG. 1, after one dry etching is performed on the metal layer in the wiring redistribution layer to obtain metal lines 20, polymer residue 40 is easily formed on a sidewall of a groove between adjacent metal lines 20. As shown in FIG. 2, due to the existence of the polymer residue 40, when a passivation layer 80 is subsequently formed, the passivation layer 80 in the groove is apt to sealing in advance, which may cause a slit inside the passivation layer 80 such that performance of the passivation layer 80 is poorer.

In view of this, embodiments of the present disclosure provide a method for fabricating a semiconductor structure, and a semiconductor structure. The method for fabricating a semiconductor structure includes: providing a substrate covered with a conductive layer; removing part of the conductive layer by dry etching to form a first groove, a depth of the first groove being less than a thickness of the conductive layer, and there being polymer residue on a groove wall of the first groove; removing part of the conductive layer corresponding to the groove wall and a groove bottom of the first groove to form conductive lines and a second groove between adjacent two of the conductive lines; and forming a passivation layer filled into the second groove. By removing part of the conductive layer corresponding to the groove wall of the first groove, the polymer deposited on the groove wall of the first groove may be removed synchronously, such that it is avoidable sealing in advance when the passivation layer is filled into the second groove subsequently, thereby further preventing a slit from appearing inside the passivation layer, which is advantageous to improving performance of the semiconductor structure.

Figure 3:
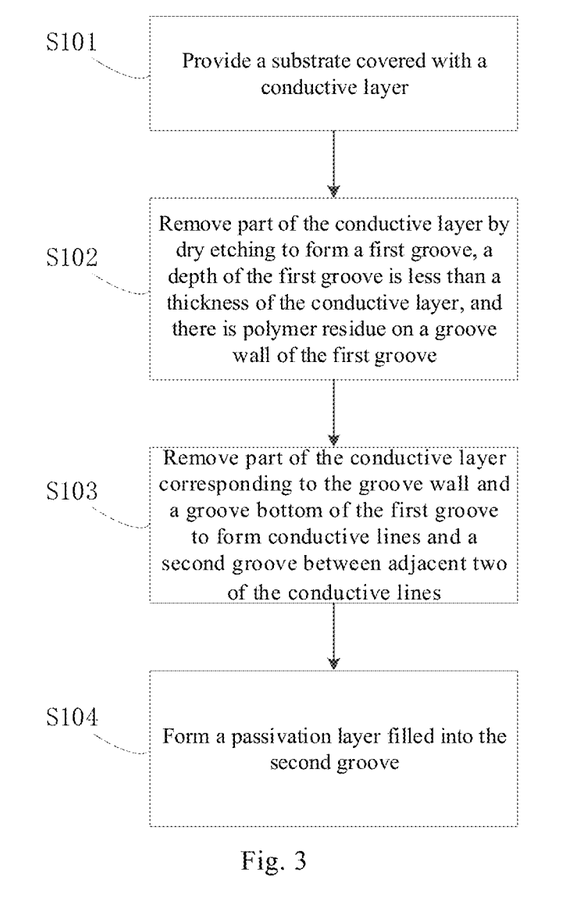
FIG. 3 is a flowchart showing steps of a method for fabricating a semiconductor structure according to an embodiment of the present disclosure.

Referring to FIG. 3, an embodiment of the present disclosure provides a method for fabricating a semiconductor structure, the method including following Steps S101 to S104.

Step S101: providing a substrate, which is covered with a conductive layer.

Figure 4:
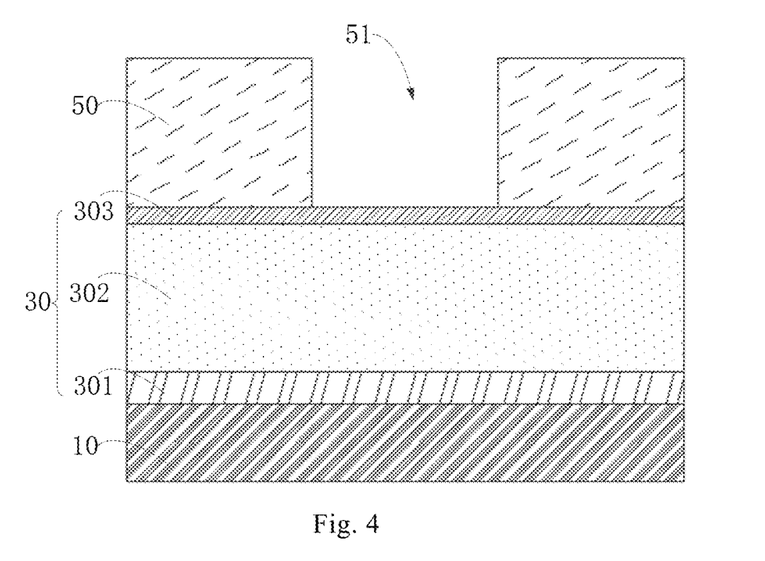
FIG. 4 is a schematic structural diagram showing a first mask layer formed in the method for fabricating a semiconductor structure according to an embodiment of the present disclosure.

In this embodiment, referring to FIG. 4, the substrate 10 may be a semiconductor substrate such as single-crystal silicon, polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 10 are not limited thereto.

In this embodiment, the conductive layer 30 may be formed by means of electroplating or deposition. For example, the conductive layer 30 may be connected to contact pads inside the substrate 10, such that the semiconductor structure can be electrically connected to outside by means of the conductive layer 30 subsequently. In an implementation manner, a material of the conductive layer 30 may include, for example, conductive metals and/or compounds such as aluminum, titanium, tungsten, and titanium nitride.

For example, the conductive layer 30 may include a plurality of sub-conductive layers sequentially arranged on the substrate 10. For example, as shown in FIG. 4, the conductive layer 30 may include three sub-conductive layers sequentially arranged on the substrate 10, i.e., a first sub-conductive layer 301, a second sub-conductive layer 302, and a third sub-conductive layer 303. For example, in an implementation manner, a material of the first sub-conductive layer 301 may include titanium, a material of the second sub-conductive layer 302 may include aluminum, and a material of the third sub-conductive layer 303 may include titanium nitride. It should be noted that this embodiment includes but is not limited thereto.

Step S102: removing part of the conductive layer by dry etching to form a first groove, a depth of the first groove being less than a thickness of the conductive layer, and there being polymer residue on a groove wall of the first groove.

Referring to FIG. 4, the removing part of the conductive layer 30 by dry etching includes: forming a first mask layer 50 on the conductive layer 30, the first mask layer 50 having a first etching opening 51.

In an implementation manner, a material of the first mask layer 50 may include a photoresist, and part of the photoresist is removed by means of an exposure and development process to form the first etching opening 51.

Figure 5:
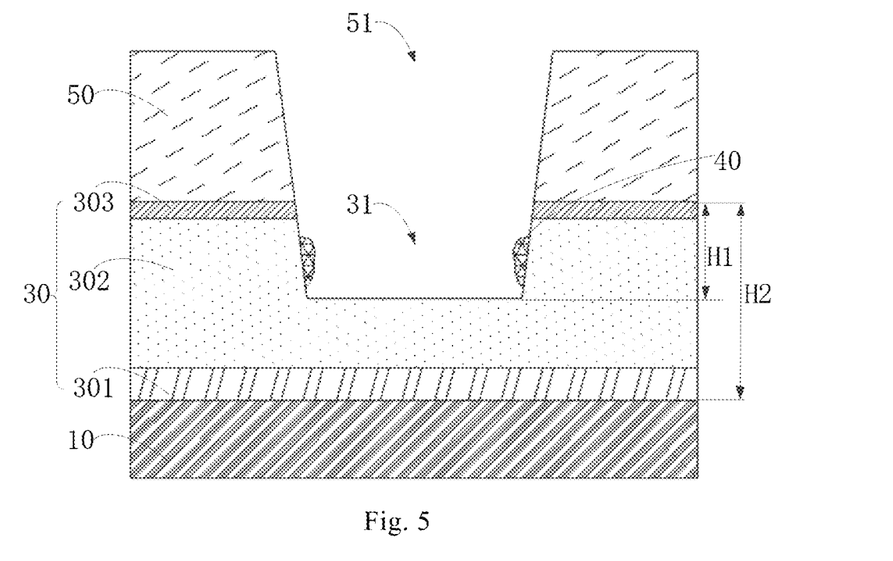
FIG. 5 is a schematic structural diagram showing a first groove formed in the method for fabricating a semiconductor structure according to an embodiment of the present disclosure.

In this embodiment, referring to FIG. 5, the removing part of the conductive layer 30 by dry etching further includes: after forming the first mask layer 50 on the conductive layer 30, etching the conductive layer 30 by using the first mask layer 50 as a mask to form the first groove 31.

It should be noted that the conductive layer 30 is dry-etched by using the first mask layer 50 as a mask, where dry-etching is a thin-film etching technology using plasma. During the etching process, the plasma bombards a surface of an object to be etched to remove the object to be etched to achieve the objective of etching. In this embodiment, the conductive layer 30 is removed by dry etching. In the process of the plasma bombardment of the conductive layer 30, a conjugate will be generated, where the conjugate will be retained on the groove wall of the first groove 31, the residual conjugate being the polymer residue 40. In the process of removing part of the conductive layer 30 by dry etching, the depth of the first groove 31 formed may be controlled by controlling time of the dry etching to ensure that the depth of the first groove 31 is smaller than the thickness of the conductive layer 30, such that subsequently the first groove 31 is further etched to remove the polymer residue 40 on the groove wall of the first groove 31.

Step S103: removing part of the conductive layer corresponding to the groove wall and a groove bottom of the first groove to form conductive lines and a second groove between adjacent two of the conductive lines.

For example, conductive lines 20 may be formed by removing part of the conductive layer 30 corresponding to the groove bottom of the first groove 31, where the formed conductive line 20 is a redistribution line, and a groove between adjacent two of the conductive lines 20 is a second groove 33. By removing part of the conductive layer 30 corresponding to the groove wall of the first groove 31, the polymer residue 40 deposited on the groove wall of the first groove 31 may be removed, such that it is avoidable sealing in advance when the passivation layer 80 is filled into the second groove 33 subsequently (even if there is still polymer residue on the sidewall of the second groove 33, a volume of the polymer residue is much smaller than that of the polymer residue in the one dry etching as shown in FIG. 1), thereby preventing a slit from appearing inside the passivation layer 80, which is advantageous to improving performance of the semiconductor structure.

Figure 6:
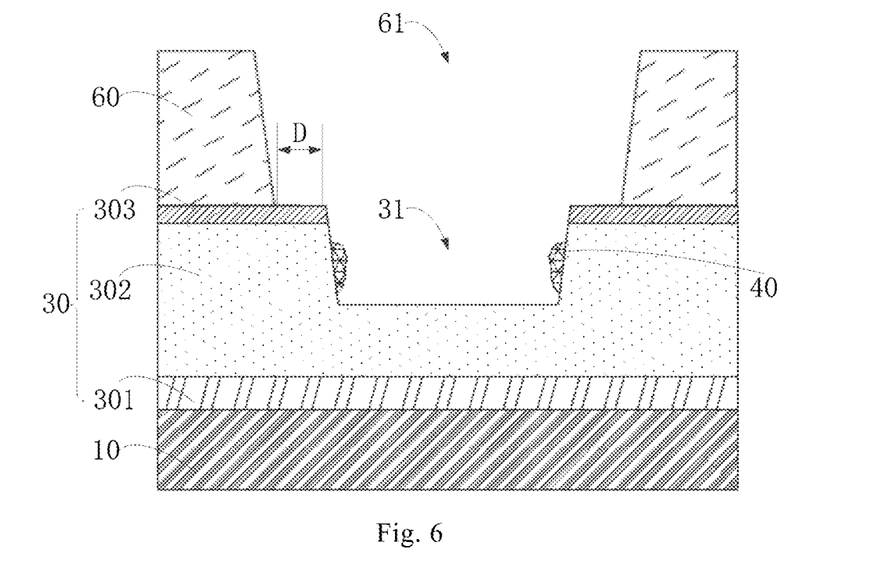
FIG. 6 is a schematic structural diagram I showing a second mask layer formed in the method for fabricating a semiconductor structure according to an embodiment of the present disclosure.
Figure 7:
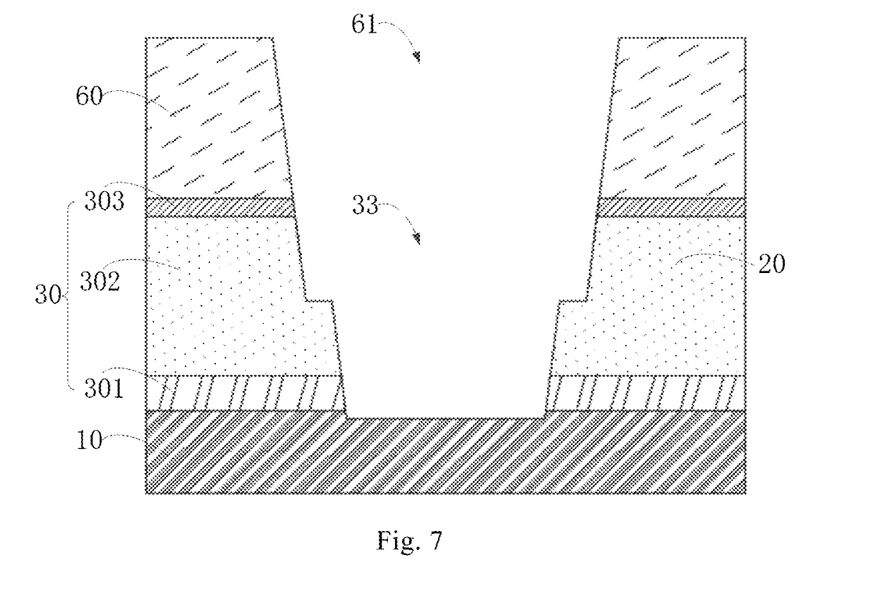
FIG. 7 is a schematic structural diagram I showing a second groove formed in the method for fabricating a semiconductor structure according to an embodiment of the present disclosure.

In this embodiment, referring to FIG. 6 and FIG. 7, the removing part of the conductive layer 30 corresponding to the groove wall and a groove bottom of the first groove 31 to form conductive lines 20 and a second groove 33 between adjacent two of the conductive lines 20 includes: forming a second mask layer 60 on the conductive layer 30, where the second mask layer 60 is provided with a second etching opening 61 arranged directly facing the first groove 31, and an area of an orthographic projection of the second etching opening 61 on the substrate 10 is greater than an area of an orthographic projection of the first etching opening 51 on the substrate 10.

In some embodiments, the second mask layer 60 may cover the first mask layer 50, and the second etching opening 61 directly faces the first groove 31. Furthermore, the first etching opening 51 directly faces the first groove 31, the second etching opening 61 directly faces the first etching opening 51, and the area of the orthographic projection of the second etching opening 61 on the substrate 10 is greater than the area of the orthographic projection of the first etching opening 51 on the substrate 10, which facilitates the subsequent removal of part of the conductive layer 30 corresponding to the groove wall of the first groove 31, such that the polymer residue 40 deposited on the groove wall of the first groove 31 is removed synchronously.

In this embodiment, the forming a second mask layer 60 on the conductive layer 30 includes: after the first groove 31 is formed, shrinking the first mask layer 50 to increase the area of the orthographic projection of the first etching opening 51 on the substrate 10, and forming the second mask layer 60 and the second etching opening 61 on the second mask layer 60.

In this embodiment, the second mask layer 60 is also the first mask layer 50 shrunk. Because the area of the orthographic projection of the first etching opening 51 on the substrate 10 is increased, that is, the area of the orthographic projection of the second etching opening 61 on the substrate 10 is greater than the area of the orthographic projection of the first etching opening 51 on the substrate 10, such that when the second mask layer 60 is used as a mask for subsequent etching, not only part of the conductive layer 30 corresponding to the groove bottom of the first groove 31 can be etched, but also part of the conductive layer 30 corresponding to the groove wall of the first groove 31 can be etched. This facilitates the subsequent removal of part of the conductive layer 30 corresponding to the groove wall of the first groove 31, such that the polymer residue 40 deposited on the groove wall of the first groove 31 is removed synchronously.

In this embodiment, the shrinking the first mask layer 50 includes: etching the first mask layer 50 to remove a sidewall of the first etching opening 51.

By removing the sidewall of the first etching opening 51, the area of the orthographic projection of the first etching opening 51 on the substrate 10 may be increased, thereby forming the second etching opening 61, where the formed second etching opening 61 directly faces the first groove 31.

In some embodiments, the first mask layer 50 may be dry-etched to remove a sidewall of the first etching opening 51. In an implementation manner, the first mask layer 50 is entirely thinned by dry etching from the upper surface and sidewalls of the first mask layer 50, to enlarge the first etching opening 51, thereby obtaining the second mask layer 60 (i.e., the thinned first mask layer) and the second etching opening 61 (i.e., the enlarged first etching opening) in the second mask layer 60. In some embodiments, an etching gas for dry etching may include at least one of oxygen, hydrogen, or nitrogen.

In this embodiment, referring to FIG. 7, the removing part of the conductive layer 30 corresponding to the groove wall and a groove bottom of the first groove 31 to form conductive lines 20 and a second groove 33 between adjacent two of the conductive lines 20 also includes: after forming a second mask layer 60, etching the conductive layer 30 by using the second mask layer 60 as a mask to form the conductive lines 20 and the second groove 33.

When the conductive layer 30 is etched using the second mask layer 60 as a mask, it may be continued to etch part of the conductive layer 30 corresponding to the groove bottom of the first groove 31 until the conductive layer 30 is etched through to form the conductive lines 20. Meanwhile, it may be continued to etch part of the conductive layer 30 corresponding to the groove wall of the first groove 31, and the polymer residue 40 deposited on the groove wall of the first groove 31 may be synchronously removed, such that it is avoidable sealing in advance when the passivation layer 80 is filled into the second groove 33 subsequently, thereby further preventing a slit from appearing inside the passivation layer 80, which is advantageous to improving performance of the semiconductor structure.

For example, referring to FIG. 6, a distance D between the second etching opening 61 and the groove wall of the first groove 31 ranges from 50 nm to 100 nm. By adjusting an etching area of the conductive layer 30, the volume of the removed polymer residue 40 may be adjusted to further remove the polymer residues 40 deposited on the groove wall of the first groove 31, such that it is avoidable sealing in advance when the passivation layer 80 is filled into the second groove 33 subsequently, and thus performance of the semiconductor structure can be further improved.

In this embodiment, referring to FIG. 7, the etching the conductive layer 30 by using the second mask layer 60 as a mask to form the second groove 33 also includes: etching the conductive layer 30 and part of the substrate 10 by using the second mask layer 60 as a mask to form the second groove 33.

When etching the conductive layer 30 using the second mask layer 60 as a mask, after part of the conductive layer 30 corresponding to the groove bottom of the first groove 31 is etched, it may be continued to be etch part of the substrate 10 corresponding to the groove bottom of the first groove 31, thereby forming the conductive lines 20. In this embodiment, the groove bottom of the formed second groove 33 is the substrate 10, and the groove wall of the formed second groove 33 includes the substrate 10 and the conductive layer 30.

For example, the etching the conductive layer 30 using the second mask layer 60 as a mask further includes: etching the conductive layer 30 by means of dry etching using the second mask layer 60 as a mask. In the process of dry etching, the conductive layer 30 is bombarded with plasma, and synchronously, the plasma can also bombard the polymer residue 40 on the groove wall of the first groove 31, such that the polymer residue 40 can be broken into pieces. In this way, the polymer residue 40 can be further removed. It is worth noting that the polymer residue 40 is removed in the process of dry etching, and synchronously, new polymer residue 40 may be formed on the groove wall of the second groove 33. Because the volume of the polymer residue 40 on the second groove 33 is smaller than that of the polymer residue 40 on the first groove 31, it is avoidable sealing in advance when the passivation layer 80 is filled into the second groove 33 subsequently, such that performance of the semiconductor structure can be improved.

Step S104: forming a passivation layer filled into the second groove.

Figure 8:
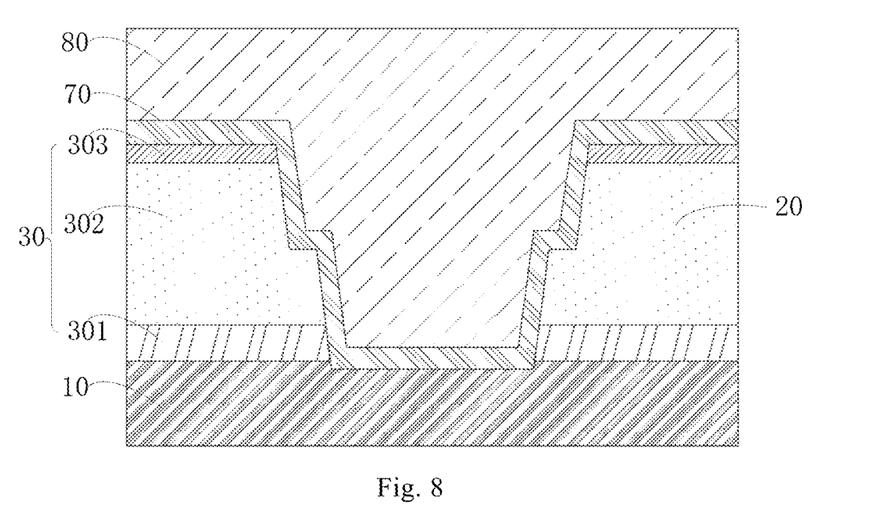
FIG. 8 is a schematic structural diagram I showing a passivation layer formed in the method for fabricating a semiconductor structure according to an embodiment of the present disclosure.

In this embodiment, referring to FIG. 8, before the forming a passivation layer 80 filled into the second groove 33, the method further includes: removing the second mask layer 60.

For example, the second mask layer 60 may be removed by cleaning with a cleaning solution. When etching part of the conductive layer 30 corresponding to the groove wall of the first groove 31, debris of the polymer residue 40 deposited on the groove wall of the first groove 31 may fall onto the groove bottom of the second groove 33. In the process of removing the second mask layer 60 by means of the cleaning solution, the debris falling onto the groove bottom of the second groove 33 may be further removed, which is advantageous to further improving the performance of the semiconductor structure.

Before forming the passivation layer 80 filled into the second groove 33, the method further includes: after removing the second mask layer 60, forming an insulating layer 70 covering the conductive lines 20 and the groove wall and the groove bottom of the second groove 33. By forming the insulating layer 70, the adjacent conductive lines 20 may be isolated. A material of the insulating layer 70 may include, for example, nitride, oxide, or oxynitride.

After the insulating layer 70 is formed, the passivation layer 80 covering the insulating layer 70 may be formed, where the passivation layer 80 is filled into the second groove 33, and the passivation layer 80 is also covered on the conductive lines 20. A material of the passivation layer 80 may include, for example, polyimide, to play a role of stress buffering and protecting the conductive lines 20. For example, the passivation layer 80 can also play a role of planarization.

An embodiment of the present disclosure provides a method for fabricating a semiconductor structure. The method for fabricating a semiconductor structure includes: providing a substrate 10 covered with a conductive layer 30; removing part of the conductive layer 30 by dry etching to form a first groove 31, a depth of the first groove 31 being less than a thickness of the conductive layer 30, and there being polymer residue 40 on a groove wall of the first groove 31; removing part of the conductive layer 30 corresponding to the groove wall and a groove bottom of the first groove 31 to form conductive lines 20 and a second groove 33 between adjacent two of the conductive lines 20; and forming a passivation layer 80 filled into the second groove 33. By removing part of the conductive layer 30 corresponding to the groove wall of the first groove 31, the polymer residue 40 deposited on the groove wall of the first groove 31 can be removed synchronously, such that it is avoidable sealing in advance when the passivation layer 80 is filled into the second groove 33 subsequently, thereby further preventing a slit from appearing inside the passivation layer 80, which is advantageous to improving performance of the semiconductor structure.

In this embodiment, referring to FIG. 5, the conductive layer 30 is etched by using the first mask layer 50 as a mask to form a first groove 31, where a depth H1 of the first groove 31 is ⅓ to ½ of a thickness H2 of the conductive layer 30. When the depth H1 of the first groove 31 is ⅓-½ of the thickness H2 of the conductive layer 30, the polymer residue 40 formed on the groove wall of the first groove 31 is easily peeled off from the first groove 31 by subsequently etching the groove wall of the first groove 31, which is advantageous to further removing the polymer residue 40, such that the performance of the semiconductor structure can be further improved.

For example, the depth of the formed first groove 31 may also be adjusted by controlling etching time. For example, the etching time when etching the conductive layer 30 by using the first mask layer 50 as a mask to form the first groove 31 may be defined as a first period of time, and the etching time when removing part of the conductive layer 30 corresponding to the groove wall and a groove bottom of the first groove 31 to form conductive lines 20 and a second groove 33 may be defined as a second period of time, where sum of the first period of time and the second period of time is total etching time. To further remove the polymer residue 40 and to further improve the performance of the semiconductor structure, the first period of time may be set to range from ⅓ to ½ of the total etching time.

In the above embodiment, the second groove 33 is formed by one shrinking process and one etching process, such that removal of the polymer residue 40 from the first groove 31 is achieved. Referring to FIGS. 9 to 13, in some other embodiments, according to actual situations of the polymer residue 40 on the first groove 31, the removing part of the conductive layer 30 corresponding to the groove wall and a groove bottom of the first groove 31 to form the conductive lines 20 and the second groove 33 may also include intermediate etching By providing a step of intermediate etching, it is advantageous to further removing the polymer residue 40 on the groove wall of the first groove 31.

Figure 9:
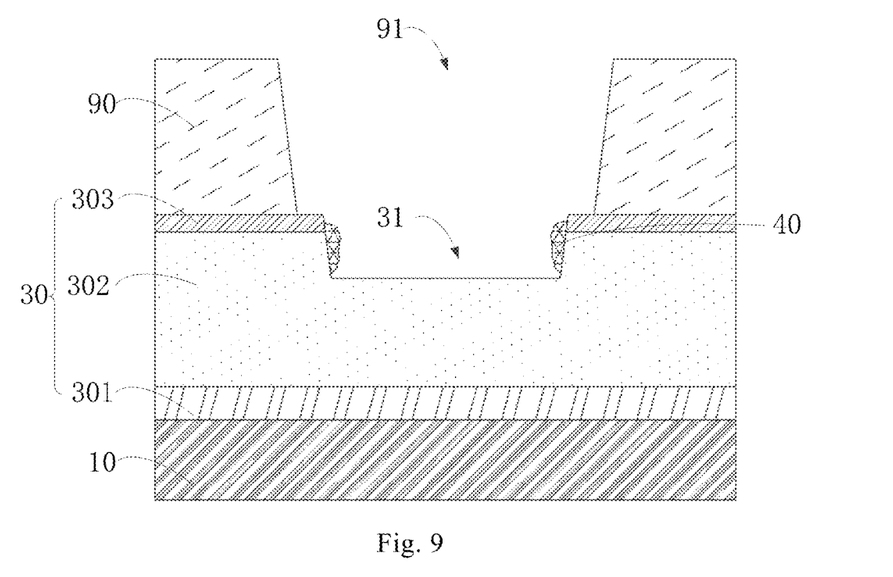
FIG. 9 is a schematic structural diagram showing an intermediate mask layer formed in the method for fabricating a semiconductor structure according to an embodiment of the present disclosure.

Referring to FIG. 9, the step of intermediate etching may include: forming an intermediate mask layer 90 on the conductive layer 30, where the intermediate mask layer 90 is provided with an intermediate etching opening 91 arranged directly facing the first groove 31. An area of an orthographic projection of the intermediate etching opening 91 on the substrate 10 is greater than the area of the orthographic projection of the first etching opening 51 on the substrate 10, and the area of the orthographic projection of the intermediate etching opening 91 on the substrate 10 is less than the area of the orthographic projection of the second etching opening 61 on the substrate 10.

In this embodiment, the forming an intermediate mask layer 90 on the conductive layer 30 includes: after the first groove 31 is formed, shrinking the first mask layer 50 to increase the area of the orthographic projection of the first etching opening 51 on the substrate 10, and forming the intermediate mask layer 90 and the intermediate etching opening 91 on the intermediate mask layer 90.

The intermediate mask layer 90 is the first mask layer 50 shrunk. Because the area of the orthographic projection of the first etching opening 51 on the substrate 10 is increased, that is, the area of the orthographic projection of the formed intermediate etching opening 91 on the substrate 10 is greater than the area of the orthographic projection of the first etching opening 51 on the substrate 10, such that when the intermediate mask layer 90 is used as a mask for subsequent etching, not only part of the conductive layer 30 corresponding to the groove bottom of the first groove 31 can be etched, but also part of the conductive layer 30 corresponding to the groove wall of the first groove 31 can be etched. This facilitates the subsequent removal of part of the conductive layer 30 corresponding to the groove wall of the first groove 31, such that the polymer residue 40 deposited on the groove wall of the first groove 31 is removed synchronously.

The shrinking the intermediate mask layer 90 includes: etching the first mask layer 50 to remove a sidewall of the first etching opening 51.

By removing the sidewall of the first etching opening 51, the area of the orthographic projection of the first etching opening 51 on the substrate 10 may be increased, thereby forming the intermediate etching opening 91, where the formed intermediate etching opening 91 directly faces the first groove 31.

In some embodiments, the first mask layer 50 may be dry-etched to remove a sidewall of the first etching opening 51. In an implementation manner, the first mask layer 50 is entirely thinned by dry etching from the upper surface and sidewalls of the first mask layer 50, to enlarge the first etching opening 51, thereby obtaining the intermediate mask layer 90 (i.e., the thinned first mask layer) and the intermediate etching opening 91 (i.e., the enlarged first etching opening) in the intermediate mask layer 90. In some embodiments, an etching gas for dry etching may include at least one of oxygen, hydrogen, or nitrogen.

Figure 10:
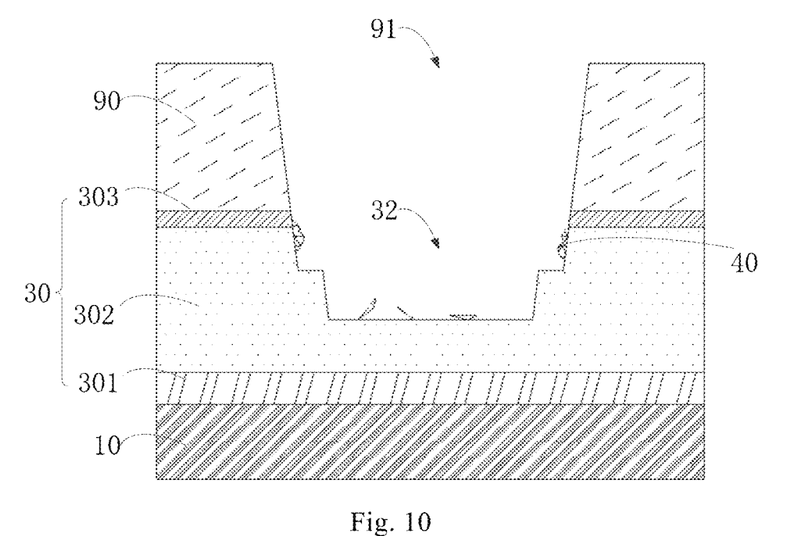
FIG. 10 is a schematic structural diagram showing an intermediate groove formed in the method for fabricating a semiconductor structure according to an embodiment of the present disclosure.

Referring to FIG. 10, the step of intermediate etching further includes: after the intermediate mask layer 90 is formed, etching the conductive layer 30 by using the intermediate mask layer 90 as a mask to form an intermediate groove 32. It is worth noting that by removing part of the conductive layer 30 corresponding to the groove wall of the first groove 31, part of polymer residue 301 deposited on the groove wall of the first groove 31 is removed synchronously. Meanwhile, in the process of intermediate etching, new polymer residue 301 will continue to be formed on the groove wall of the intermediate groove 32, where the volume of the newly-formed polymer residues 301 is smaller than that of the old one.

Referring to FIG. 10, the depth of the intermediate groove 32 is greater than that of the first groove 31 and less than that of the second groove 33. During the etching process, part of the conductive layer 30 corresponding to the groove bottom of the first groove 31 is removed, such that the depth of the intermediate groove 32 is greater than that of the first groove 31. Subsequently, it is continued to etch part of the conductive layer 30 corresponding to the groove bottom of the intermediate groove 32, such that the depth of the intermediate groove 32 is smaller than that of the second groove 33. During the etching process, the depth of the formed intermediate groove 32 may be controlled by controlling the etching time.

Figure 11:
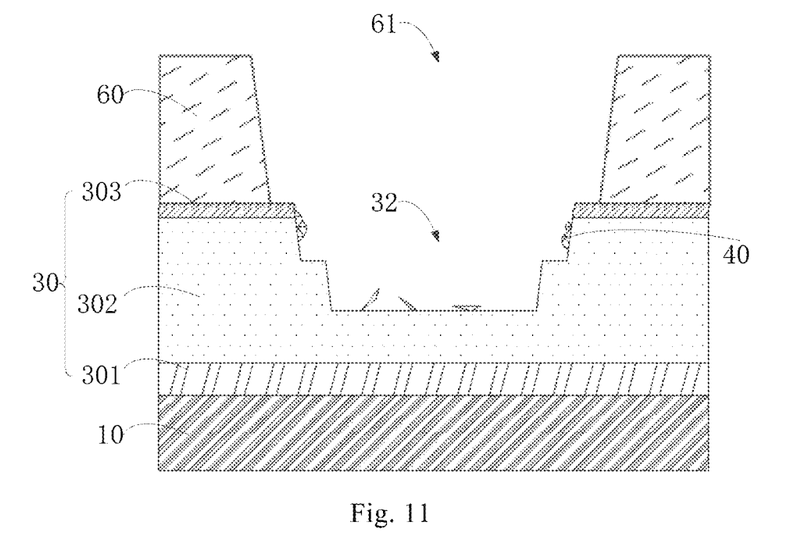
FIG. 11 is a schematic structural diagram II showing a second mask layer formed in the method for fabricating a semiconductor structure according to an embodiment of the present disclosure.
Figure 12:
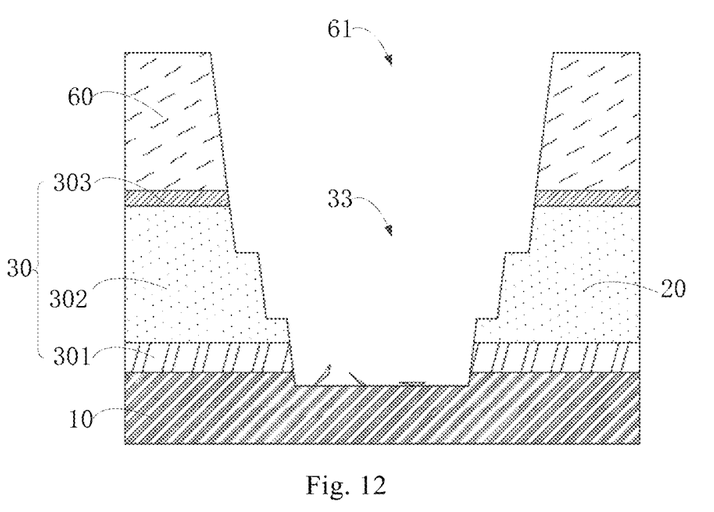
FIG. 12 is a schematic structural diagram II showing a second groove formed in the method for fabricating a semiconductor structure according to an embodiment of the present disclosure.

Referring to FIG. 11 and FIG. 12, after the intermediate groove 32 is formed, the removing part of the conductive layer 30 corresponding to the groove wall and a groove bottom of the first groove 31 to form the conductive lines 20 and the second groove 33 further includes: removing part of the conductive layer 30 corresponding to a groove wall and a groove bottom of the intermediate groove 32 to form the conductive lines 20 and the second groove 33.

Figure 13:
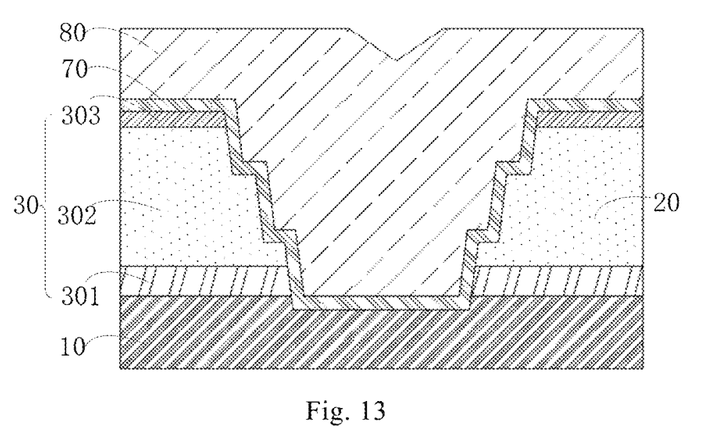
FIG. 13 is a schematic structural diagram II showing a passivation layer formed in the method for fabricating a semiconductor structure according to an embodiment of the present disclosure.

In some embodiments, after the intermediate groove 32 is formed, a second mask layer 60 is formed on the conductive layer 30, where the second mask layer 60 is provided with a second etching opening 61 arranged directly facing the intermediate groove 32. An area of an orthographic projection of the second etching opening 61 on the substrate 10 is greater than an area of an orthographic projection of the intermediate etching opening 91 on the substrate 10. After the second mask layer 60 is formed, the conductive layer 30 is etched using the second mask layer 60 as a mask to form the conductive lines 20 and the second groove 33 to completely remove the polymer residue 40. Referring to FIG. 13, after the polymer residue 40 is completely removed, the passivation layer 80 filled into the second groove 33 is formed.

In some embodiments, the intermediate etching in the above embodiment may be performed for many times, and during the intermediate etching of each time, an area of an orthographic projection of the intermediate etching opening 91 on the substrate 10 is greater than an area of an orthographic projection of the intermediate etching opening 91 on the substrate 10 in the intermediate etching of previous time. According to the volume of the polymer residue 40 formed on the first groove 31, the polymer residue 40 may be further removed by adjusting number of steps of the intermediate etching. The area of the orthographic projection of the intermediate etching opening 91 on the conductive layer 30 during the intermediate etching of each time is enlarged than the previous time. In this way, part of the conductive layer 30 corresponding to the groove wall of the intermediate groove 32 can be remove during the intermediate etching of each time, such that the polymer residue 40 deposited on the groove wall of the intermediate groove 32 can be removed synchronously. It is worth noting that the step of intermediate etching of each time may be implemented by the steps in the above embodiments, which is not to be repeated here.

The embodiments of the present disclosure further provide a semiconductor structure, which is formed by the above method for fabricating a semiconductor structure. The method for fabricating a semiconductor structure includes: providing a substrate 10 covered with a conductive layer 30; removing part of the conductive layer 30 by dry etching to form a first groove 31, a depth of the first groove 31 being less than a thickness of the conductive layer 30, and there being polymer residue 40 on a groove wall of the first groove 31; removing part of the conductive layer 30 corresponding to the groove wall and a groove bottom of the first groove 31 to form conductive lines 20 and a second groove 33 between adjacent two of the conductive lines 20; and forming a passivation layer 80 filled into the second groove 33. By removing part of the conductive layer 30 corresponding to the groove wall of the first groove 31, the polymer residue 40 deposited on the groove wall of the first groove 31 can be removed synchronously, such that it is avoidable sealing in advance when the passivation layer 80 is filled into the second groove 33 subsequently, thereby further preventing a slit from appearing inside the passivation layer 80, which is advantageous to improving performance of the semiconductor structure.

Those skilled in the art may clearly understand that for the convenience and brevity of description, division of the above functional modules is merely taken as an example for illustration. In actual applications, the foregoing functions may be allocated to different functional modules and implemented according to needs. That is, an internal structure of an apparatus is divided into different functional modules to implement all or part of the functions described above. For a detailed working process of the apparatus described above, reference may be made to the corresponding process in the foregoing method embodiments, and details are not described herein again.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
   providing a substrate covered with a conductive layer;
   removing part of the conductive layer by dry etching to form a first groove, a depth of the first groove being less than a thickness of the conductive layer, and there being polymer residue on a groove wall of the first groove;
   removing remaining part of the conductive layer corresponding to the groove wall and a groove bottom of the first groove to form conductive lines and a second groove between adjacent two of the conductive lines, wherein the polymer residue on the groove wall of the first groove is removed while forming the second groove; and
   forming a passivation layer filled into the second groove; and wherein
   the removing the part of the conductive layer by dry etching to form the first groove comprises:
   forming a first mask layer on the conductive layer, the first mask layer having a first etching opening; and
   etching the conductive layer by using the first mask layer as a mask to form the first groove; and
   the removing the remaining part of the conductive layer corresponding to the groove wall and a groove bottom of the first groove to form conductive lines and a second groove between adjacent two of the conductive lines comprises:
   forming a second mask layer on the conductive layer, the second mask layer being provided with a second etching opening arranged directly facing the first groove, and an area of an orthographic projection of the second etching opening on the substrate being greater than the area of the orthographic projection of the first etching opening on the substrate; and
   etching the conductive layer by using the second mask layer as a mask to form the conductive lines and the second groove.

2. The method for fabricating a semiconductor structure according to claim 1, wherein the forming a second mask layer on the conductive layer comprises:
   after the first groove is formed, shrinking the first mask layer to increase the area of the orthographic projection of the first etching opening on the substrate, and forming the second mask layer and the second etching opening on the second mask layer.

3. The method for fabricating a semiconductor structure according to claim 2, wherein the shrinking the first mask layer comprises:
   etching the first mask layer to remove a sidewall of the first etching opening.

4. The method for fabricating a semiconductor structure according to claim 3,
   wherein the etching the first mask layer comprises dry etching, and an etching gas for the dry etching comprises at least one of oxygen, hydrogen, or nitrogen.

5. The method for fabricating a semiconductor structure according to claim 1, wherein a depth of the first groove is ⅓ to ½ of a thickness of the conductive layer.

6. The method for fabricating a semiconductor structure according to claim 1, wherein a distance between the second etching opening and the groove wall of the first groove ranges from 50 nm to 100 nm.

7. The method for fabricating a semiconductor structure according to claim 1, wherein the etching the conductive layer by using the second mask layer as a mask to form the second groove comprises:
   etching the conductive layer and part of the substrate by using the second mask layer as a mask to form the second groove.

8. The method for fabricating a semiconductor structure according to claim 1, wherein the conductive layer is etched by means of dry etching by using the second mask layer as a mask.

9. The method for fabricating a semiconductor structure according to claim 1, wherein the removing remaining part of the conductive layer corresponding to the groove wall and a groove bottom of the first groove to form the conductive lines and the second groove comprises intermediate etching, the intermediate etching comprising:
   forming an intermediate mask layer on the conductive layer, the intermediate mask layer being provided with an intermediate etching opening arranged directly facing the first groove, the area of the orthographic projection of the intermediate etching opening on the substrate being greater than the area of the orthographic projection of the first etching opening on the substrate, and the area of the orthographic projection of the intermediate etching opening on the substrate being less than the area of the orthographic projection of the second etching opening on the substrate; and
   etching the conductive layer by using the intermediate mask layer as a mask to form an intermediate groove, a depth of the intermediate groove being greater than the depth of the first groove and less than a depth of the second groove.

10. The method for fabricating a semiconductor structure according to claim 9, wherein after the intermediate groove is formed, the removing remaining part of the conductive layer corresponding to the groove wall and a groove bottom of the first groove to form the conductive lines and the second groove further comprises:
    removing remaining part of the conductive layer corresponding to a groove wall and a groove bottom of the intermediate groove to form the conductive lines and the second groove.

11. The method for fabricating a semiconductor structure according to claim 9, wherein the forming an intermediate mask layer on the conductive layer comprises:
    after the first groove is formed, shrinking the first mask layer to increase the area of the orthographic projection of the first etching opening on the substrate, and forming the intermediate mask layer and the intermediate etching opening on the intermediate mask layer.

12. The method for fabricating a semiconductor structure according to claim 11, wherein the shrinking the intermediate mask layer comprises:
    etching the first mask layer to remove a sidewall of the first etching opening.

13. The method for fabricating a semiconductor structure according to claim 12, wherein
    etching the intermediate mask layer comprises dry etching, and an etching gas for the dry etching comprises at least one of oxygen, hydrogen, or nitrogen.

14. The method for fabricating a semiconductor structure according to claim 9, wherein the intermediate etching is performed for many times, and during the intermediate etching of each time, the area of the orthographic projection of the intermediate etching opening on the substrate is greater than the area of the orthographic projection of the intermediate etching opening on the substrate in the intermediate etching of previous time.

15. The method for fabricating a semiconductor structure according to claim 1, wherein before the forming a passivation layer filled into the second groove, the method further comprises:
removing the second mask layer.

16. The method for fabricating a semiconductor structure according to claim 15, wherein before the forming a passivation layer filled into the second groove, the method further comprises: after removing the second mask layer, forming an insulating layer covering the conductive lines and the groove wall and the groove bottom of the second groove.

17. The method for fabricating a semiconductor structure according to claim 1, wherein the conductive layer comprises a plurality of sub-conductive layers sequentially arranged on the substrate.

* * * * *